(12) United States Patent
Oshio et al.

(10) Patent No.: US 10,364,963 B2
(45) Date of Patent: Jul. 30, 2019

(54) LIGHT-EMITTING DEVICE

(71) Applicant: Panasonic Intellectual Property Management Co., Ltd., Osaka (JP)

(72) Inventors: Shozo Oshio, Osaka (JP); Shinji Shibamoto, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 203 days.

(21) Appl. No.: 15/534,185

(22) PCT Filed: Nov. 11, 2015

(86) PCT No.: PCT/JP2015/005624
§ 371 (c)(1),
(2) Date: Jun. 8, 2017

(87) PCT Pub. No.: WO2016/092743
PCT Pub. Date: Jun. 16, 2016

(65) Prior Publication Data
US 2017/0343188 A1 Nov. 30, 2017

(30) Foreign Application Priority Data

Dec. 12, 2014 (JP) ................. 2014-251452

(51) Int. Cl.
*G01N 21/64* (2006.01)
*F21V 9/30* (2018.01)
(Continued)

(52) U.S. Cl.
CPC ............ *F21V 9/30* (2018.02); *C09K 11/7774* (2013.01); *F21K 9/64* (2016.08); *H01S 5/005* (2013.01);
(Continued)

(58) Field of Classification Search
CPC .......... F21V 9/30; F21K 9/64; F21Y 2115/30; C09K 11/7774; H01S 5/005; H01S 5/32341; H01S 5/4012
See application file for complete search history.

(56) References Cited

U.S. PATENT DOCUMENTS

2011/0279022 A1 11/2011 Winkler et al.
2011/0298358 A1 12/2011 Tsai et al.
(Continued)

FOREIGN PATENT DOCUMENTS

JP 2012-524995 A 10/2012
JP 2013-28667 A 2/2013
(Continued)

OTHER PUBLICATIONS

Hoshina Teruhiko, Luminescence of Rare Earth Ions, Research Information Office of Sony Central Research Laboratory, 1983, pp. 74-85 (with partial translation).
(Continued)

*Primary Examiner* — Kiho Kim
(74) *Attorney, Agent, or Firm* — Renner, Otto, Boisselle & Sklar, LLp

(57) ABSTRACT

A light-emitting device 1 according to the present invention includes: a solid-state light-emitting element 10 that radiates laser light; and a wavelength converter 50 including plural types of phosphors which receive the laser light and radiate light. The phosphors included in the wavelength converter 50 are substantially composed of $Ce^{3+}$-activated phosphors. The above-described light-emitting device includes at least a warm-color $Ce^{3+}$-activated phosphor that receives the laser light and radiates light having a light emission peak within a wavelength range of 580 nm or more to less than 660 nm,
(Continued)

and light-emitting components radiated by the phosphors are composed of only light-emitting components derived from $Ce^{3+}$.

16 Claims, 6 Drawing Sheets

(51) Int. Cl.
    *F21K 9/64*     (2016.01)
    *C09K 11/77*     (2006.01)
    *H01S 5/00*     (2006.01)
    *F21Y 115/30*     (2016.01)
    *H01S 5/323*     (2006.01)
    *H01S 5/40*     (2006.01)

(52) U.S. Cl.
    CPC ....... *F21Y 2115/30* (2016.08); *H01S 5/32341* (2013.01); *H01S 5/4012* (2013.01)

(56) References Cited

U.S. PATENT DOCUMENTS

| 2012/0057325 | A1 | 3/2012 | Hikmet |
| 2015/0002824 | A1 | 1/2015 | Kasugai et al. |
| 2015/0015136 | A1* | 1/2015 | Kim et al. ......... C09K 11/7734 313/503 |

FOREIGN PATENT DOCUMENTS

| JP | 2013-143436 A | 7/2013 |
| JP | 5427324 B1 | 2/2014 |
| JP | 2012-505269 A | 3/2017 |

OTHER PUBLICATIONS

International Search Report for corresponding International Application No. PCT/JP2015/005624, dated Feb. 16, 2016.

* cited by examiner (a)

(b)

(c)

LIGHT-EMITTING DEVICE

TECHNICAL FIELD

The present invention relates to a light-emitting device including: a solid-state light-emitting element that radiates laser light; and a wavelength converter that includes plural types of phosphors.

BACKGROUND ART

Heretofore, there has been known a light-emitting device composed by combining: a solid-state light-emitting element that radiates laser light; and a wavelength converter that includes plural types of phosphors. As such a light-emitting device having a light source that radiates the laser light, for example, there are known: a laser lighting device as described in Patent Literature 1; and a laser projector. In the light-emitting device having the light source that radiates the laser light, high density excitation of the phosphors is conducted in general.

Heretofore, a $Eu^{2-}$-activated phosphor has been used as such a phosphor for use in the light-emitting device having the light source that radiates the laser light. For example, as a $Eu^{2+}$-activated red light-emitting phosphor, there are known $(Ba,Sr,Ca)S:Eu^{2+}$, $(Ba,Sr,Ca)AlSiN_3:Eu^{2+}$, $(Ba,Sr,Ca)_2Si_5N_8:Eu^{2+}$, and the like, which are described in Patent Literature 1.

CITATION LIST

Patent Literature

Patent Literature 1: Japanese Translation of PCT Publication No. 2012-524995
Patent Literature 2: Japanese Translation of PCT Publication No. 2012-505269
Patent Literature 3: Japanese Unexamined Patent Application Publication No. 2013-28667

Non Patent Literature

Non-patent Literature 1: "Luminescence of Rare Earth Ions (original title is in Japanese)", by HOSHINA Teruhiko, Research Information Office of Sony Central Research Laboratory, 1983 (S58), pp. 74-85

SUMMARY OF INVENTION

Technical Problem

However, the above-described light-emitting device that uses the $Eu^{2+}$-activated red light-emitting phosphor has had problems that a light emission output is low, and that the light emission output decreases as an operating time elapses. Note that the decrease of the light emission output, which occurs as the operating time elapses, is presumed to be caused since the $Eu^{2+}$-activated red light-emitting phosphor is oxidized or leaves a crystal structure thereof deteriorated, for example, by being locally heated to 400° C. or more by being irradiated with the laser light. With regard to the $Eu^{2+}$-activated phosphor, a composition or crystal structure thereof is prone to be changed since $Eu^{2+}$ is prone to be oxidized to $Eu^{3+}$. Moreover, the decrease of the light emission output, which occurs as the operating time elapses, is also presumed to be caused since the light emission of the phosphor is saturated because the number of electronically excited states is increased and saturated by the high density excitation caused by the laser light. Hereinafter, a degree of maintenance of the light emission output, which decreases as the operating time elapses, is referred to as long-term reliability. For example, a case where a degree of the decrease of the light emission output, which is caused as the operating time elapses, is small is referred to as high long-term reliability, and a case where the degree of the decrease of the light emission output, which is caused as the operating time elapses, is large is referred to as low long-term reliability.

Note that a $Ce^{3+}$-activated phosphor is also known as a phosphor other than the $Eu^{2+}$-activated phosphor. For example, $Y_3Mg_2(AlO_4)(SiO_4)_2:Ce^{3+}$, which is described in PTLs 2 and 3, or the like is known as the $Ce^{3+}$-activated red light-emitting phosphor. With regard to the $Ce^{3+}$-activated phosphor, a composition and crystal structure thereof are difficult to change since $Ce^{3+}$ thereof is less susceptible to oxidation and reduction. However, in the $Ce^{3+}$-activated phosphor, in particular, a $Ce^{3+}$-activated red light-emitting phosphor has had problems that a Stokes shift is large and that temperature quenching is large. Therefore, it has been difficult to use the $Ce^{3+}$-activated red light-emitting phosphor for the light-emitting device having a light source such as the laser light, the light-emitting device having large excitation energy and easily raising a temperature of the phosphor.

The present invention has been made in consideration of the above-described problems. It is an object of the present invention to provide a light-emitting device having a light source that emits the laser light, the light-emitting device having a high output and high long-term reliability.

Solution to Problem

In order to solve the above-described problems, the light-emitting device according to an aspect of the present invention includes: a solid-state light-emitting element that radiates laser light; and a wavelength converter including plural types of phosphors which receive the laser light and radiate light. The phosphors included in the wavelength converter are substantially composed of $Ce^{3-}$-activated phosphors. The above-described light-emitting device includes at least a warm-color $Ce^{3+}$-activated phosphor that receives the laser light and radiates light having a light emission peak within a wavelength range of 580 nm or more to less than 660 nm, and light-emitting components radiated by the phosphors are composed of only light-emitting components derived from $Ce^{3+}$.

BRIEF DESCRIPTION OF DRAWINGS

FIG. 6A shows a state where a phosphor coating liquid is coated on a transparent substrate; FIG. 6B shows a state where a phosphor coating liquid dried body is formed on the transparent substrate; and FIG. 6C shows a state where a phosphor layer is formed on the transparent substrate.

DESCRIPTION OF EMBODIMENTS

Figure 1:
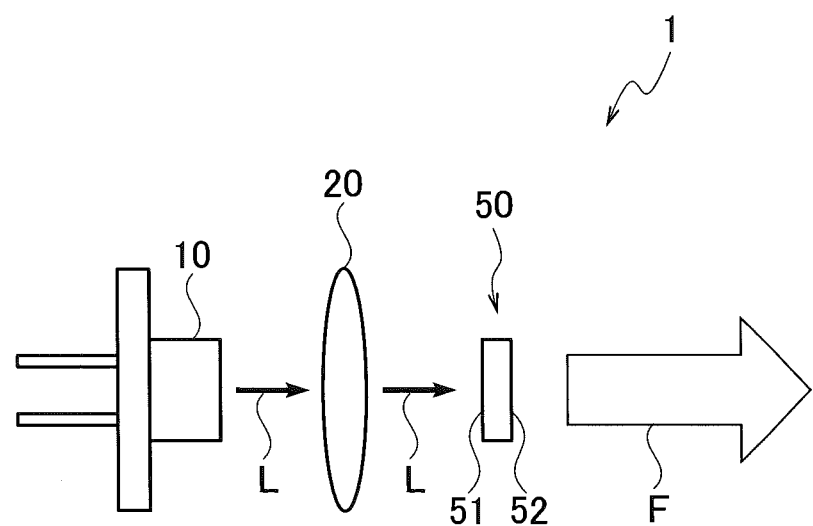
FIG. 1 is a schematic diagram showing a light-emitting device according to a first embodiment of the present invention.

Hereinafter, a light-emitting device according to this embodiment will be described in detail with reference to the drawings. FIG. 1 is a schematic diagram showing a light-emitting device according to a first embodiment.
[Light-Emitting Device]

First Embodiment

A light-emitting device 1 according to the first embodiment includes: a solid-state light-emitting element 10 that radiates laser light; and a wavelength converter 50 including plural types of phosphors which receive the laser light and radiate light. Moreover, between the solid-state light-emitting element 10 and the wavelength converter 50, the light-emitting device 1 further includes a lens 20 that condenses the laser light, which is radiated from the solid-state light-emitting element 10, to the wavelength converter 50. As shown in FIG. 1, the light-emitting device 1 is configured so that the wavelength converter 50 can radiate fluorescence F when the laser light L radiated from the solid-state light-emitting element 10 is made incident onto the wavelength converter 50 through the lens 20. Note that the lens 20 may be eliminated in a case where it is not necessary to condense the laser light to the wavelength converter 50. That is, the lens 20 is not an essential component for the light-emitting device 1. In the light-emitting device 1, the types of the phosphors included in the wavelength converter 50 are specific.
<Solid-State Light-Emitting Element>

The solid-state light-emitting element 10 is a solid-state light-emitting element that radiates laser light. As such a solid-state light-emitting element, for example, a laser diode such as a surface emitting laser diode is used. As shown in FIG. 1, the solid-state light-emitting element 10 radiates laser light L.

If the laser light has a maximum intensity value within a wavelength range of 420 nm or more to less than 480 nm, preferably 440 nm or more to less than 470 nm, then the phosphors included in the wavelength converter 50 are easy to emit light efficiently. Moreover, if the laser light has the maximum intensity value within the above-described wavelength range, then the laser light becomes blue light with good visibility, and can be used without waste as not only excitation light of the phosphors but also output light of the light-emitting device 1.

The lens 20 condenses the laser light L, which is radiated from the solid-state light-emitting element 10, to the wavelength converter 50. The laser light L is condensed to the wavelength converter 50 through the lens 20. Note that, in a case where it is not necessary to condense the laser light L to the wavelength converter 50, the lens 20 does not have to be provided in the light-emitting device. That is, the lens 20 is not an essential component for the light-emitting device. Moreover, an optical fiber can also be used in place of the lens 20 as in a light-emitting device 1A according to a second embodiment to be described later.
<Wavelength Converter>

The wavelength converter 50 includes plural types of phosphors which receive laser light and radiate light. As shown in FIG. 1, by receiving the laser light L, the wavelength converter 50 radiates the fluorescence F with a longer wavelength than that of the laser light L. Note that, since the wavelength converter 50 shown in FIG. 1 is a first wavelength converter among first to third wavelength converters to be described later, the wavelength converter 50 is configured to receive the laser light L on a front surface 51 thereof, and to radiate the fluorescence F from a rear surface 52 thereof. In contrast, the second or third wavelength converter receives the laser light L on a front surface thereof, and radiates the fluorescence F from the same front surface. The second or third wavelength converter will be described later.

It is preferable that the wavelength converter 50 be made of an inorganic material. Here, the inorganic material means a material other than organic materials, and includes a concept including ceramics and metals. Note that organic siloxane, which is composed in such a manner that a part of siloxane is substituted with an organic functional group such as an alkyl group, is also defined as the inorganic material.

If the wavelength converter 50 is composed of the inorganic material, then the wavelength converter 50 has higher heat radiation properties than a conventional wavelength converter including an organic material such as sealing resin. Therefore, even in a case where the phosphors are subjected to high density excitation by the laser light radiated from the solid-state light-emitting element 10, such a temperature rise of the wavelength converter 50 can be suppressed effectively. As a result, temperature quenching of the phosphors in the wavelength converter 50 is suppressed, thus making it possible to increase an output of the emitted light.

There are plural types in a specific configuration of the wavelength converter 50 composed of the inorganic material. For example, there are: a configuration including a transparent substrate and a phosphor layer (first wavelength converter); a configuration including a metal substrate and a phosphor layer (second wavelength converter); a configuration composed of light-transmissive fluorescent ceramics prepared by sintering a phosphor (third wavelength converter); and the like. Moreover, also in the first wavelength converter, there are cases where the transparent substrate includes the phosphors and does not include the phosphors. Hereinafter, the respective wavelength converters will be described.
[First Wavelength Converter]

Figure 2:
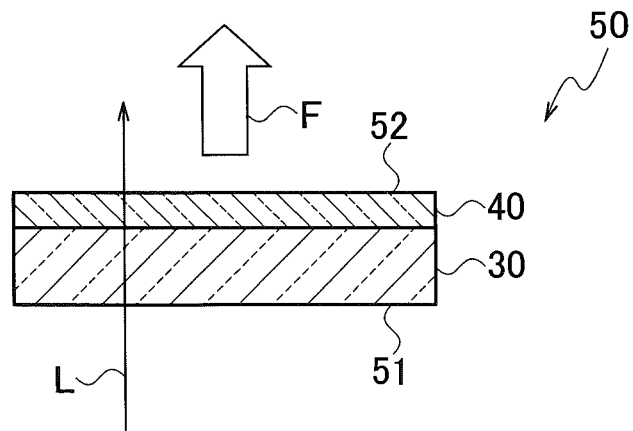
FIG. 2 is a cross-sectional view showing an example of a wavelength converter.

FIG. 2 is a cross-sectional view showing an example of the first wavelength converter 50 that composes the light-emitting device 1 shown in FIG. 1. As shown in FIG. 2, the wavelength converter 50 includes: a transparent substrate 30 through which the laser light passes; and a phosphor layer 40 formed on a surface of this transparent substrate 30, the phosphor layer 40 including a phosphor. The wavelength converter 50 includes plural types of the phosphors. In a case where the transparent substrate 30 does not include the phosphor, the phosphor layer 40 includes plural types of the phosphors. In a case where the transparent substrate 30 includes the phosphor, the phosphor layer 40 includes one type or more of the phosphors. In the wavelength converter 50, the laser light L is made incident thereonto from the front surface 51 as the surface of the transparent substrate 30, and the fluorescence F is radiated from the rear surface 52 as a surface of the phosphor layer 40.

Note that, though FIG. 1 shows an example where the wavelength converter 50 is single, a plurality of the wavelength converters 50 may be provided. In this case, each of the plurality of wavelength converters 50 may be configured to include single or plural types of the phosphors. For example, such a wavelength converter 50, which includes only a phosphor of a warm color such as yellow orange and red, and such a wavelength converter 50, which includes only a phosphor of the green color, may be present individually.

(Transparent Substrate)

The transparent substrate 30 has transparency that enables the laser light L to pass therethrough, and is configured to allow the laser light L, which is incident thereonto from the front surface 51 as the surface of the transparent substrate 30 concerned, to pass therethrough. As the transparent substrate 30, for example, a quartz substrate or a light-transmissive fluorescent ceramic substrate is used. Here, the light-transmissive fluorescent ceramic substrate is a substrate that includes a phosphor and has light transmissivity. In a case where the transparent substrate 30 is the light-transmissive fluorescent ceramic substrate, the phosphor layer 40 becomes a layer including one or more phosphors since the transparent substrate 30 includes the phosphor. As the phosphor, a phosphor explained in the phosphor layer to be described later is used. The laser light L that passes through the transparent substrate 30 is introduced into the phosphor layer 40. Note that, in the case where the transparent substrate 30 includes the phosphor, the fluorescence F is also radiated from the transparent substrate 30 in addition to the laser light L.

(Phosphor Layer)

The phosphor layer 40 includes: the phosphor; and an inorganic adhesive that adheres this phosphor to the transparent substrate 30. In the phosphor layer 40, the phosphor that receives the laser light L radiates the fluorescence.

In the phosphor layer 40, the phosphor is adhered by the inorganic adhesive. As the inorganic adhesive, an inorganic adhesive having light transmissivity is used. As the inorganic adhesive having light transmissivity, for example, alumina, silica, low melting-point glass and the like in the form of ultrafine particles are used.

The plural types of phosphors included in the wavelength converter 50 are substantially composed of $Ce^{3+}$-activated phosphors. Therefore, the phosphors included in the phosphor layer 40 are also substantially composed of the $Ce^{3+}$-activated phosphors. Here, a phrase "substantially composed of the $Ce^{3+}$-activated phosphors" means that the phosphors are composed of only the $Ce^{3+}$-activated phosphors except for phosphors mixed as impurities.

$Ce^{3+}$ is a light emission center having a shortest light emission lifetime ($10^{-8}$ to $10^{-7}$ s) among rare earth ions, and accordingly, electron energy of the $Ce^{3+}$-activated phosphors in an excited state is relaxed in an extremely short time. Therefore, the electron energy of the $Ce^{3+}$-activated phosphors in the excited state can be relaxed in an extremely short time even under high density excitation thereof generated by irradiation of the laser light. Hence, if the $Ce^{3+}$-activated phosphors are used as the phosphors included in the wavelength converter 50, then luminescence saturation as a saturation phenomenon of a light output, which is caused by an increase of the number of electronically excited states, can be suppressed.

Moreover, a stable valence of the rare earth ions is trivalent, and $Ce^{3+}$ is a light emission center having such a stable trivalence. Accordingly, even if the $Ce^{3+}$-activated phosphors generate heat due to the high density excitation generated by the irradiation of the laser light, deterioration of phosphor crystals thereof, which may be caused in the $Eu^{2+}$-activated phosphor owing to oxidation of $Eu^{2+}$ in the $Eu^{2+}$-activated phosphor concerned to $Eu^{3-}$, is also unlikely to occur. Therefore, if the $Ce^{3+}$-activated phosphors are used as the phosphors included in the wavelength converter 50, then long-term reliability thereof is enhanced.

As described above, the $Ce^{3+}$-activated phosphors can suppress the luminescence saturation, and also have high long-term reliability, and accordingly, are suitable as the phosphors for the wavelength converter 50 of the light-emitting device 1 having the light source that irradiates the laser light.

Moreover, it is preferable that all of the $Ce^{3+}$-activated phosphors included in the wavelength converter 50 be $Ce^{3+}$-activated oxide phosphors. Therefore, it is preferable that all of the $Ce^{3+}$-activated phosphors included in the phosphor layer 40 be also $Ce^{3+}$-activated oxide phosphors. Oxides are substances which are stable in the atmosphere, and accordingly, in a case where the oxide phosphors generate heat due to the high density excitation generated by the laser light, deterioration of phosphor crystals thereof, which may be caused in nitride phosphors, is unlikely to occur. Therefore, if all of the phosphors included in the wavelength converter 50 are the oxide phosphors, then long-term reliability of the light-emitting device 1 is enhanced.

The phosphors included in the wavelength converter 50 are substantially composed of the $Ce^{3+}$-activated phosphors as described above, and include at least a warm-color $Ce^{3+}$-activated phosphor that receives laser light from the solid-state light-emitting element 10 and radiates light having a light emission peak within a wavelength range of 580 nm or more to less than 660 nm. That is, the phosphors included in the wavelength converter 50 includes at least the warm-color $Ce^{3+}$-activated phosphor that receives the above-described laser light and radiates the light having a light emission peak within the wavelength range of 580 nm or more to less than 660 nm. Here, the warm-color $Ce^{3+}$-activated phosphor stands for a $Ce^{3+}$-activated phosphor that radiates warm-color light. Moreover, the warm-color light stands for light having a light emission peak within the wavelength range of 580 nm or more to less than 660 nm. The warm-color light includes: yellow orange light having a light emission peak within a wavelength range of 580 nm or more to less than 600 nm; and red light having a light emission peak within a wavelength range of 600 nm or more to less than 660 nm. Therefore, the warm-color $Ce^{3+}$-activated phosphor stands for a $Ce^{3+}$-activated phosphor including at least either one of a yellow-orange $Ce^{3+}$-activated phosphor that radiates the above-described yellow orange light, a red $Ce^{3+}$-activated phosphor that radiates the above-described red light. Specifically, the yellow-orange $Ce^{3+}$-activated phosphor is a $Ce^{3+}$-activated phosphor that radiates the yellow orange light having a light emission peak within the wavelength range of 580 nm or more to less than 600 nm. The red $Ce^{3+}$-activated phosphor is a $Ce^{3+}$-activated phosphor that radiates the red light having a light emission peak within the wavelength range of 600 nm or more to less than 660 nm.

It is preferable that the phosphors included in the wavelength converter 50 include at least the red $Ce^{3+}$-activated phosphor that radiates the red light having a light emission peak within the wavelength range of 600 nm or more to less than 660 nm among the warm-color $Ce^{3+}$-activated phosphors. If the phosphors included in the wavelength converter 50 include at least the red $Ce^{3+}$-activated phosphor, then this is preferable since it is easy to obtain output light with high color rendering properties, which results from a large general color rendering index (Ra), by the fact that a red light component in the output light concerned is increased.

In general, the warm-color $Ce^{3+}$-activated phosphor has larger Stokes shift and temperature quenching than a $Ce^{3+}$-activated phosphor having other luminescent color, such as a green $Ce^{3+}$-activated phosphor. Therefore, heretofore, among the $Ce^{3+}$-activated phosphors, it has been difficult to use the warm-color $Ce^{3+}$-activated phosphor for such a light-emitting device having a light source such as laser light, in which excitation energy is large and a temperature of the phosphor is prone to rise. In contrast, in the light-emitting device 1 of this embodiment, the wavelength converter 50 is composed of the inorganic material, and accordingly, heat radiation properties of the wavelength converter 50 is higher than that of the conventional wavelength converter including an organic material. Therefore, in the light-emitting device 1 of this embodiment, it is made possible to use the warm-color $Ce^{3+}$-activated phosphor.

As the warm-color $Ce^{3+}$-activated phosphor that receives the laser light from the solid-state light-emitting element 10 and radiates the light having a light emission peak within the wavelength range of 580 nm or more to less than 660 nm, for example, an orange or red $Ce^{3+}$-activated phosphor having a garnet structure to be described later is used.

Note that a $Ce^{3-}$-activated phosphor, which has a luminescent color other than that of the warm-color $Ce^{3+}$-activated phosphor, and specifically, has a luminescent color within a visible range of a shorter wavelength than orange, has smaller Stokes shift and temperature quenching than the warm-color $Ce^{3+}$-activated phosphor, and accordingly, such a problem of the temperature quenching is unlikely to occur. Therefore, in the light-emitting device 1, it is possible to form all phosphors, which include the warm-color phosphors, into the $Ce^{3+}$-activated phosphors. As described above, it is possible to form all phosphors into the $Ce^{3+}$-activated phosphors, and accordingly, in the light-emitting device 1, the problem of the temperature quenching is unlikely to occur, and high light emission intensity and high long-term reliability are obtained.

It is preferable that all of the $Ce^{3+}$-activated phosphors included in the wavelength converter 50 be the $Ce^{3+}$-activated phosphors having the garnet structure. Therefore, it is preferable that all of the $Ce^{3+}$-activated phosphors included in the phosphor layer 40 be also the $Ce^{3+}$-activated phosphors having the garnet structure. Oxides having the garnet structure are excellent in thermal conductivity. Therefore, if all of the $Ce^{3+}$-activated phosphors included in the wavelength converter 50 are the $Ce^{3+}$-activated phosphors having the garnet structure, then heat generated from the phosphors following the wavelength conversion is radiated efficiently, the temperature quenching of the phosphors is suppressed, and it becomes possible to increase the output of the light emission.

As the $Ce^{3+}$-activated phosphors having the garnet structure, which are as described above, for example, phosphors shown below are used.

As a blue green $Ce^{3+}$-activated phosphor having the garnet structure, for example, $Ca_2YZr_2(AlO_4)_3:Ce^{3+}$ is used. Here, the blue green $Ce^{3+}$-activated phosphor is a $Ce^{3+}$-activated phosphor that radiates light having a light emission peak within a wavelength range of 480 nm or more to less than 500 nm.

As a green $Ce^{3+}$-activated phosphor having the garnet structure, for example, there are used $Lu_3Al_2(AlO_4)_3:Ce^{3+}$, $(Y,Lu)_3Al_2(AlO_4)_3:Ce^{3+}$, $Y_3Al_2(AlO_4)_3:Ce^{3+}$, $Y_3Ga_2(AlO_4)_3:Ce^{3+}$, and $Ca_3Sc_2(SiO_4)_3:Ce^{3-}$. Here, the green $Ce^{3+}$-activated phosphor is a $Ce^{3+}$-activated phosphor that radiates light having a light emission peak within a wavelength range of 500 nm or more to less than 560 nm.

Among such green $Ce^{3+}$-activated phosphors as described above, $Lu_3Al_2(AlO_4)_3:Ce^{3+}$ radiates green light with a larger amount of a blue green light component than $Y_3Ga_2(AlO_4)_3:Ce^{3+}$. Therefore, if a $Lu_3Al_2(AlO_4)_3:Ce^{3+}$-activated green phosphor is used, then it is easy to obtain a light-emitting device that radiates output light having a relatively high general color rendering index (Ra), and the $Lu_3Al_2(AlO_4)_3:Ce^{3+}$-activated green phosphor is preferable as a phosphor for lighting.

As a yellow green to orange $Ce^{3+}$-activated phosphor having the garnet structure, for example, $(Y,Gd)_3Al_2(AlO_4)_3:Ce^{3+}$ is used. Here, the yellow green to orange $Ce^{3+}$-activated phosphor is a $Ce^{3+}$-activated phosphor that radiates light having a light emission peak within a wavelength range of 560 nm or more to less than 600 nm.

As a red $Ce^{3+}$-activated phosphor having the garnet structure, for example, $Y_3Mg_2(AlO_4)(SiO_4)_2:Ce^{3+}$ and $Y_3MgAl(AlO_4)_2(SiO_4):Ce^{3+}$ are used. Here, the red $Ce3+$-activated phosphor is a $Ce^{3+}$-activated phosphor that radiates light having a light emission peak within a wavelength range of 600 nm or more to less than 660 nm.

The light-emitting device of this embodiment includes at least the warm-color $Ce^{3+}$-activated phosphor that radiates light having a light emission peak within the wavelength range of 580 nm to less than 660 nm, and arbitrarily includes the $Ce^{3+}$-activated phosphor other than the warm-color $Ce^{3+}$-activated phosphor.

Moreover, it is desirable that the phosphors in the wavelength converter 50 include a $Ce^{3+}$-activated phosphor that receives the laser light emitted from the solid-state light-emitting element 10 and radiates light having a light emission peak within a wavelength range of 480 nm to less than 520 nm, preferably, 480 nm or more to less than 500 nm. As such a $Ce^{3+}$-activated phosphor as described above, the blue green $Ce^{3+}$-activated phosphor or the green $Ce^{3+}$-activated phosphor is used.

Note that, if the plural types of $Ce^{3+}$-activated phosphors are used in combination, a light-emitting device 1 can also be obtained, which radiates a fluorescence having a light emission peak within a wavelength range of 480 nm or more to less than 660 nm, the wavelength range covering blue green, green, yellow, orange and red.

In the light-emitting device of this embodiment, light-emitting components radiated by the phosphors are composed of only light-emitting components derived from $Ce^{3+}$. Here, "light-emitting components radiated by the phosphors" stand for components of light radiated by the phosphors after the phosphors receive the laser light radiated from the solid-state light-emitting element 10. In usual, the light-emitting components radiated from the light-emitting device are composed of: the laser light radiated from the solid-state light-emitting element 10; and light-emitting components radiated by the phosphors. Therefore, the light-emitting components radiated by the phosphors are equal to light components obtained by subtracting the laser light, which is radiated from the solid-state light-emitting element 10, from all light-emitting components radiated from the light-emitting device. Note that a meaning of the foregoing "light-emitting components derived from $Ce^{3+}$" will be described later.

In the light-emitting device of this embodiment, the light-emitting components radiated by the phosphors are composed of only the light-emitting components derived from $Ce^{3+}$, whereby an afterglow time of each of the light-emitting components included in the output light exhibits an ultrashort afterglow of $10^{-8}$ to $10^{-7}$ s, that is, 10 ns or more to 100 ns or less. Therefore, in accordance with the light-emitting device of this embodiment, light emission saturation under the high density excitation caused by the irradiation of the laser light can be suppressed.

The meaning of the foregoing "light-emitting components derived from $Ce^{3+}$" is described. This "light-emitting components derived from $Ce^{3+}$" stands for light-emitting components emitted following energy relaxation from the $5d^1$ electron state (excited state) to the $4f^1$ electron state (ground state), the energy relaxation being intrinsic to $Ce^{3+}$.

"Light-emitting components derived from $Ce^{3+}$" is described more in detail. A large number of shapes of intrinsic light emission spectra as light-emitting components of activators (light emission centers) in the phosphors have already been exemplified in specialized books. As heretofore known, "light-emitting components derived from $Ce^{3+}$" in the light emission spectra of the $Ce^{3+}$-activated phosphors for use in the light-emitting device of this embodiment have distinctive shapes in which two broad light-emitting components different in peak wavelength overlap each other at tail portions of the peaks. Specifically, "light-emitting components derived from $Ce^{3+}$" each acquire a shape including: a main light emission spectrum component that is broad; and a sub peak or a shoulder, which overlaps a long wavelength side of this main light emission spectrum component at the tail portion of the peak.

A unique shape of each of "light-emitting components derived from $Ce^{3+}$" is caused by allowed transition in which energy relaxation is performed from one excited level to two ground levels, and by the fact that 5d electrons of the outermost shells, which are likely to be affected by a crystalline field, are concerned in the excited level. Here, specifically, the allowed transition in which the energy relaxation is performed from one excited level to two ground levels is allowed transition in which energy relaxation is performed from one excited level ($^2D(5d^1)$) to two ground levels ($^2F_j(4f^1)$, J=5/2, 7/2).

Note that, since the $Ce^{3+}$-activated phosphors for use in this embodiment includes plural types of the $Ce^{3+}$-activated phosphors, such a plurality of "light-emitting components derived from $Ce^{3+}$" are present. Therefore, in many cases, in the $Ce^{3+}$-activated phosphors for use in this embodiment, the above-described unique shape does not appear clearly in the light emission spectra, and it is difficult to clearly determine "light-emitting components derived from $Ce^{3+}$" based on only the shape of the light-emission spectra. However, even in such a case, the shape of the light emission spectra and elemental analysis for the wavelength converter are combined with each other, whereby "light-emitting components derived from $Ce^{3+}$" in the light emission spectra can be determined.

Note that, among the $Ce^{3+}$-activated phosphors, coactivation-type phosphors are also known, which emit light-emitting components derived from ions other than $CE^{3+}$, the ions being $Tb^{3+}$, $Eu^{2+}$, $Mn^{2+}$ and the like, by coactivation that takes the above-described ions other than $Ce^{3+}$ as a light emission center. Many of these coactivation-type phosphors emit at least "emission line-like light-emitting component derived from $Tb^{3+}$" and "broad light-emitting component which is derived from $Eu^{2+}$ or $Mn^{2+}$ and has a single peak wavelength". However, the $Ce^{3+}$-activated phosphors for use in this embodiment are substantially different from the coactivation-type phosphors as described above.

A spectral half width of the laser light radiated from the solid-state light-emitting element 10 is narrower than a spectral half width of light radiated from an LED, and is less than 20 nm for example. Therefore, for example, in a case where white-based output light is attempted to be obtained by additive mixture of three primary colors of light, which are blue, green and red, by using the blue laser light radiated from the solid-state light-emitting element 10, and by using a green phosphor and a red phosphor, then the output light is prone to become light with a distorted spectral distribution significantly different from the spectral distribution of the natural light. That is, since the spectral half width of the blue laser light is narrow, output of light of a blue green wavelength range adjacent to the blue laser light component becomes insufficient, and a spectral distribution of a blue green light portion of the output light from the light-emitting device is distorted. Therefore, the color rendering properties of the output light becomes prone to be lowered.

In contrast, if the wavelength converter 50 includes the blue green $Ce^{3+}$-activated phosphors, then the blue green light adjacent to the blue laser light component is compensated, whereby the spectral distribution of the output light from the light-emitting device 1 is approximated to the spectral distribution of the natural light, and the color rendering properties tends to be enhanced.

If the phosphors included in the wavelength converter 50 are powdery, then the glare of the output light from the light-emitting device 1 is relaxed, and accordingly, this is preferable. That is, if the phosphors included in the wavelength converter 50 are powdery, then the glare of the output light from the light-emitting device 1 is relaxed, and accordingly, this is preferable.

The laser light is coherent light in which phases of lightwaves at arbitrary two points in a light flux are invariant in time, and accordingly, is prone to cause light interference and generate unnatural glare called "speckle". However, this unnatural glare gives discomfort to a viewer of the light, and accordingly, it is preferable that this unnatural glare should not be present in the illumination light. If the phosphors included in the phosphor layer 40 are powdery, then the laser light is scattered by a light scattering action of the phosphors, and accordingly, the glare of the output light from the light-emitting device 1 is relaxed.

(Oxidation Resistance of Phosphors)

In the phosphor layer 40 that composes the wavelength converter 50, the $Ce^{3+}$-activated phosphors excellent in oxidation resistance as described above are used. Hereinafter, there is shown an example of comparison test results of the oxidation resistance of the $Ce^{3+}$-activated phosphors and the oxidation resistance of the $Eu^{2+}$-activated phosphors.

As examples of the $Ce^{3+}$-activated phosphors, there were selected a powdery $Y_3Al_2(AlO_4)_3:Ce^{3+}$-green phosphor (commercial product: Sample A) and a powdery $Y_3Mg_2(AlO_4)(SiO_4)_2:Ce^{3+}$-red phosphor (prototype: Sample B).

Moreover, as an example of the $Eu^{2+}$-activated phosphor, powdery $CaAlSiN_3$:$Eu^{2+}$-red phosphor (commercial product: Sample C) was selected.

The oxidation resistance of each of the phosphors was evaluated by heating the phosphors in the atmosphere within a range of 400 to 1200° C. for 1 hour.

Note that, in the trial production of the $Y_3Mg_2(AlO_4)(SiO_4)_2$:$Ce^{3+}$-red phosphor (Sample B), a composition thereof was set to $(Y_{0.98}Ce_{0.02})_3Mg_2(AlO_4)(SiO_4)_2$. Sample B was synthesized by taking, as raw materials of the phosphor, yttrium oxide ($Y_2O_3$), cerium oxide ($CeO_2$), magnesium oxide (MgO), aluminum oxide ($Al_2O_3$) and silicon dioxide ($SiO_2$), and by using a solid-state reaction known in public. In the solid-state reaction, aluminum fluoride ($AlF_3$) and potassium carbonate ($K_2CO_3$) were used as reaction promoters (fluxes).

Note that, with regard to mixing ratios of the reaction promotors to the raw materials of the phosphor, 0.015 mol of $AlF_3$ and 0.005 mol of $K_2CO_3$ were mixed with respect to 1 mol of the $Y_3Mg_2(AlO_4)(SiO_4)_2$:$Ce^{3+}$-red phosphor.

The solid-state reaction described above was performed by using a tubular atmosphere furnace known in public. Specifically, mixed powder of the raw materials of the phosphor and of the reaction promoters was disposed in a mixed gas atmosphere of 96% of nitrogen and 4% of hydrogen, and was fired at 1500° C. for 2 hours by using the tubular atmosphere furnace. In this way, the $Y_3Mg_2(AlO_4)(SiO_4)_2$:$Ce^{3+}$-red phosphor (prototype: Sample B) was synthesized.

Note that, by X-ray diffraction, it was confirmed that Sample B already fired is a compound $(Y,Ce)_3Mg_2(AlO_4)(SiO_4)_2$.

Figure 4:
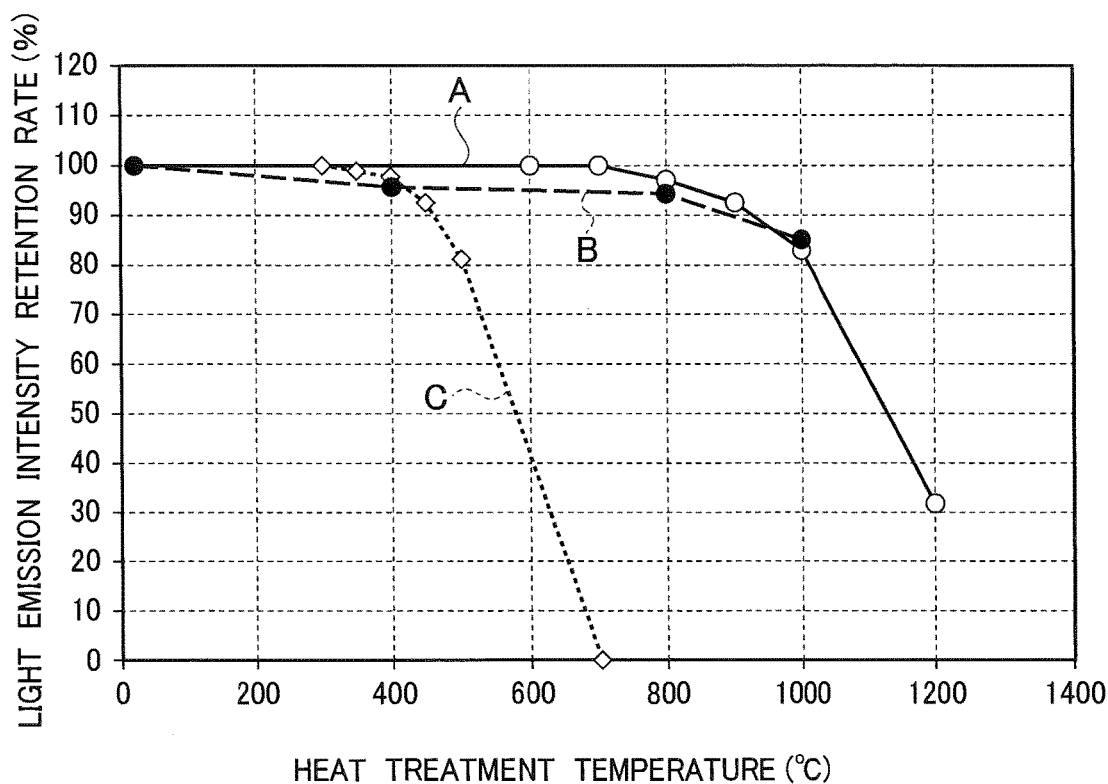
FIG. 4 is a view showing a relationship between a heat treatment temperature and light emission intensity of a phosphor in an atmosphere.

For each of Sample A, Sample B and Sample C, a relationship between a heat treatment temperature and light emission intensity (height of light emission peak) in the atmosphere was measured. FIG. 4 shows results. In FIG. 4, reference symbol A represents a graph of the $Y_3Al_2(AlO_4)_3$:$Ce^{3+}$-green phosphor (Sample A). In FIG. 4, reference symbol B represents a graph of the $Y_3Mg_2(AlO_4)(SiO_4)_2$:$Ce^{3+}$-red phosphor (Sample B). In FIG. 4, reference symbol C represents a graph of the $CaAlSiN_3$:$Eu^{2+}$-red phosphor (Sample C).

From FIG. 4, it is seen that the light emission intensity of the $CaAlSiN_3$:$Eu^{2+}$-red phosphor (Sample C) was decreased significantly by the heating at 400° C. or more in the atmosphere. In contrast, it is seen that the light emission intensity of each of the $Y_3Al_2(AlO_4)_3$:$Ce^{3+}$-green phosphor (Sample A) and the $Y_3Mg_2(AlO_4)(SiO_4)_2$:$Ce^{3+}$-red phosphor (Sample B) was hardly decreased even by the heating at 800° C. in the atmosphere.

Moreover, for each of Sample A, Sample B and Sample C, initial light emission intensity when the heating is not performed is defined as 100%, and there was investigated a heating temperature in the atmosphere when the initial light emission intensity was decreased to 80%. This temperature was approximately 500° C. in the $CaAlSiN_3$:$Eu^{2+}$-red phosphor (Sample C). In contrast, this temperature of each of the $Y_3Al_2(AlO_4)_3$:$Ce^{3+}$-green phosphor (Sample A) and the $Y_3Mg_2(AlO_4)(SiO_4)_2$:$Ce^{3+}$-red phosphor (Sample B) was as high as approximately 1000° C.

From the above, it is seen that stability of fluorescence properties when the phosphor is heated in the atmosphere is higher in the $Y_3Al_2(AlO_4)_3$:$Ce^{3+}$-green phosphor and the $Y_3Mg_2(AlO_4)(SiO_4)_2$:$Ce^{3+}$-red phosphor than in the $CaAlSiN_3$:$Eu^{2+}$-red phosphor.

Note that a reason why the stability of the fluorescence properties is higher in the $Y_3Al_2(AlO_4)_3$:$Ce^{3+}$-green phosphor and the $Y_3Mg_2(AlO_4)(SiO_4)_2$:$Ce^{3+}$-red phosphor than in the $CaAlSiN_3$:$Eu^{2+}$-red phosphor is that a stable valence of the rare earth ions which function as the light emission center, specifically, $Eu^{2+}$ and $Ce^{3+}$ is trivalent.

That is, when the $Eu^{2+}$-activated phosphor is heated in the atmosphere, $Eu^{2+}$ is prone to be oxidized and become $Eu^{3+}$, and accordingly, the light emission intensity by $Eu^{2+}$ is likely to be reduced. Meanwhile, the $Ce^{3+}$-activated phosphor is unlikely to cause the oxidation and reduction of $Ce^{3+}$ even if being heated in the atmosphere, and accordingly, such light emission intensity by $Ce^{3+}$ is unlikely to be changed.

It is generally known that $Eu^{2+}$ in the $Eu^{2+}$-activated phosphor is prone to be oxidized, and that $Ce^{3+}$ in the $Ce^{3+}$-activated phosphor has high stability against the oxidation and the reduction. Therefore, the comparison result of the oxidation resistance to the heating in the atmosphere among Sample A, Sample B and Sample C, which are described above, apply to $Ce^{3+}$-activated phosphors other than Sample A and Sample B and to $Eu^{2+}$-activated phosphors other than Sample C in a similar way.

As described above, the $Ce^{3+}$-activated phosphors are superior to the $Eu^{2+}$-activated phosphors in oxidation resistance to the heating in the atmosphere. Therefore, the phosphor layer 40, which uses only the $Ce^{3+}$-activated phosphors as phosphors, and the wavelength converter 50, which includes the phosphor layer 40, are excellent in the oxidation resistance to the heating in the atmosphere. The phosphor layer 40 and the wavelength converter 50 are excellent in the oxidation resistance to the heating, and accordingly, the deterioration of the phosphor layer 40 and the wavelength converter 50 owing to the heat of the phosphors, which is caused at the time when the phosphor layer 40 and the wavelength converter 50 are used and manufactured, is suppressed.

The deterioration of the phosphor layer 40 and the wavelength converter 50 owing to the heat of the $Ce^{3+}$-activated phosphors is small, and accordingly, it is possible to manufacture the phosphor layer 40 and the wavelength converter 50 in the atmosphere under a relatively high-temperature condition. That is, it becomes possible to adopt a wide temperature condition in the manufacture of the phosphor layer 40 and the wavelength converter 50, and accordingly, it becomes unnecessary to adopt a temperature condition in which the heat resistance is taken into consideration, and room for choice of the manufacturing process is increased.
(Functions)

A description will be made of functions of the light-emitting device 1 according to the first embodiment. Note that, for convenience of explanation, a description will be made of a case where the transparent substrate 30 does not include phosphors, and the phosphor layer 40 includes the plural types of phosphors.

First, as shown in FIG. 1, the laser light L radiated from the solid-state light-emitting element 10 is condensed to the wavelength converter 50 through the lens 20. As shown in FIG. 2, the laser light L radiated to the wavelength converter 50 passes through the transparent substrate 30 and the phosphor layer 40. Moreover, when the laser light L passes through the phosphor layer 40, the phosphors included in the phosphor layer 40 radiate the fluorescence F. In this way, the light-emitting device 1 radiates light, which includes the laser light L and the fluorescence F, as the output light. Note that, though FIG. 1 makes an illustration as if the wavelength converter 50 radiated only the fluorescence F, the wavelength converter 50 may be configured to also radiate the laser light L in the case where the laser light L passes through the wavelength converter 50. For example, if the laser light L is blue laser light, and the fluorescence F is green light and red light, then white-based output light is obtained by additive mixture of three primary colors of light, which are blue, green and red. Moreover, if the fluorescence F includes blue green light, then this is preferable since good color rendering properties are brought. Moreover, in a case where the transparent substrate 30 is a light-transmissive fluorescent ceramic substrate that includes the phosphors and has light transmissivity, then the fluorescence F is radiated also from the transparent substrate 30.

It is desirable that the light-emitting device 1 radiate output light in which a correlated color temperature is 2500 K or more to less than 7000 K, preferably 2700 K or more to less than 5500 K, more preferably 3000 K or more to less than 4000 K. If the correlated color temperature of the output light of the light-emitting device 1 stays within the above-described range, then such a light-emitting device 1 that radiates light preferable as the illumination light is obtained. As methods for setting the correlated color temperature of the output light of the light-emitting device 1 within the above-described range, there are used a method of selecting the laser light L different in wavelength range and a method of adjusting the types and amounts of the plural types of the phosphors included in the wavelength converter 50.

It is desirable that the light-emitting device 1 radiate output light in which a general color rendering index Ra is 80 or more to less than 90. If the general color rendering index Ra of the output light of the light-emitting device 1 stays within the above-described range, then light-emitting device 1 that radiates the light preferable as the illumination light is obtained. As methods for setting the general color rendering index Ra of the output light of the light-emitting device 1 within the above-described range, there are used a method of selecting the laser light L different in wavelength range and a method of adjusting the types and amounts of the plural types of the phosphors included in the wavelength converter 50.

(Manufacturing Method of Wavelength Converter)

A manufacturing method of the wavelength converter 50 will be described. First, the transparent substrate 30 is prepared, and a phosphor coating liquid to be coated on a surface of the transparent substrate 30 is prepared. For example, the phosphor coating liquid includes a solvent, a thickener, an inorganic adhesive and the phosphor. For example, distilled water is used as a solvent. For example, polyethylene oxide (PEO) is used as a thickener. For example, ultrafine particle alumina is used as the inorganic adhesive. For example, the phosphor coating liquid is prepared by dissolving the thickener in the solvent, and thereafter, by further adding the phosphor and the adhesive in this order, followed by stirring. In a case where the phosphor coating liquid includes the plural types of the phosphors, the phosphor coating liquid includes the green phosphor and the red phosphor for example. Blended amounts of the respective phosphors in the phosphor coating liquid are adjusted, whereby a color tone of the light emitted from the wavelength converter can be adjusted. Moreover, mixed amounts of the phosphors in the phosphor coating liquid and the distilled water are changed, whereby viscosity of the phosphor coating liquid can be adjusted, and a thickness of the phosphor layer can be adjusted.

Figure 3:
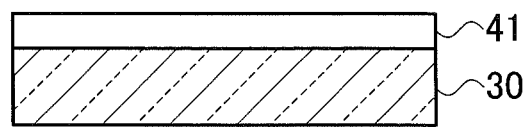
FIGS. 3A to 3C are views explaining a manufacturing process of the wavelength converter.
Figure 3:
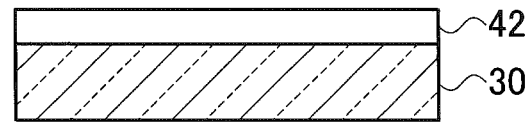
Figure 3:
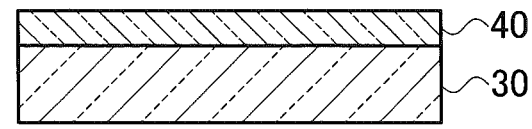

Next, as shown in FIG. 3A, the phosphor coating liquid is dropped on the surface of the transparent substrate 30, and the transparent substrate 30 with the dropped phosphor coating liquid is left standing, whereby a phosphor coating liquid layer 41 is formed on the surface of the transparent substrate 30. Moreover, as shown in FIG. 3B, the phosphor coating liquid layer 41 is left standing, for example, at a heating temperature of 40 to 80° C. for 5 to 30 minutes, whereby the phosphor coating liquid layer 41 is dried, and a phosphor coating liquid dried body layer 42 is formed. Next, the transparent substrate 30 on the surface of which the phosphor coating liquid dried body layer 42 is formed is heated to a burnout temperature of the thickener, for example, to approximately 600° C. In this way, the thickener is burned out, and as shown in FIG. 3C, the phosphor layer 40 having the light transmissivity is formed on the surface of the transparent substrate 30, and the wavelength converter 50 is obtained.

(First Modification Example of First Embodiment)

A first modification example of the first embodiment will be described. The first modification example is an example where the wavelength converter 50 of the light-emitting device 1 according to the first embodiment is replaced by a wavelength converter 50A as a second wavelength converter.

[Second Wavelength Converter]

Figure 5:
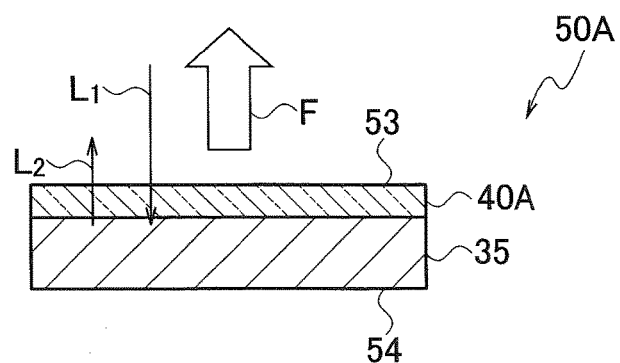
FIG. 5 is a cross-sectional view showing a first modification example of the wavelength converter.

FIG. 5 is a cross-sectional view showing an example of the second wavelength converter 50A. As shown in FIG. 5, the wavelength converter 50A includes: a metal substrate 35 on which laser light is reflected; and a phosphor layer 40A formed on a surface of the metal substrate 35, the phosphor layer 40A including a phosphor. The wavelength converter 50A receives laser light $L_1$ incident from a front surface 53 as a surface of the phosphor layer 40A, and the laser light $L_1$ is reflected on an interface between the phosphor layer 40A and the metal substrate 35, and becomes laser light $L_2$. Moreover, from the front surface 53 as the surface of the phosphor layer 40A, there is radiated fluorescence F radiated from the phosphor excited by the laser light $L_1$ and $L_2$.

(Metal Substrate)

The metal substrate 35 is a metal plate on which the laser light L and the fluorescence F are reflected. For example, an aluminum substrate is used as the metal substrate 35. The laser light $L_1$ is reflected on the metal substrate 35, and becomes the laser light $L_2$. Both of the laser light $L_1$ and the laser light $L_2$ pass through the phosphor layer 40A, excite the phosphor, and cause the phosphor to radiate the fluorescence F.

(Phosphor Layer)

The phosphor layer 40A includes: the phosphor; and an inorganic adhesive that adheres this phosphor to the metal substrate 35. The phosphor that composes the phosphor layer 40A is similar to the phosphor that composes the phosphor layer 40 of the first wavelength converter 50, and accordingly, a description thereof is omitted. Note that, since the metal substrate 35 does not include the phosphor, the phosphor layer 40A includes plural types of the phosphors.

In the phosphor layer 40A, the phosphor is adhered by the inorganic adhesive. As the inorganic adhesive, an inorganic adhesive having light transmissivity is used. As the inorganic adhesive having light transmissivity, for example, there are used polymethylsilsesquioxane (PMSQ), alumina, silica, and the like. Moreover, a PMSQ gel is preferable in the PMSQ. The PMSQ gel is excellent in transparency, and accordingly, the phosphor layer 40A has light transmissivity. Note that the PMSQ gel is a resultant obtained in such a manner that a PMSQ sol having fluidity is cured.

(Functions)

Functions of the first modification example of the first embodiment will be described. The functions of the first modification example of the first embodiment are the same as the functions of the light-emitting device 1 according to the first embodiment except that a direction where the fluorescence F is radiated from the wavelength converter 50A is different from that of the first wavelength converter 50 of the light-emitting device 1. Therefore, the description of the functions will be partially omitted.

As shown in FIG. 5, the laser light that has passed through the lens 20 of FIG. 1 is made incident as the laser light $L_1$ from the front surface 53 that is the surface of the phosphor layer 40A of the wavelength converter 50A of the first modification example. The laser light $L_1$ is reflected on the interface between the phosphor layer 40A and the metal substrate 35, and becomes the laser light $L_2$. In the phosphor layer 40A, the fluorescence F is radiated from the phosphors excited by the laser light $L_1$ and the laser light $L_2$, which have passed therethrough, and the fluorescence F is radiated from the front surface 53.

A correlated color temperature and general color rendering index Ra of the output light of the first modification example of the first embodiment are the same as those of the light-emitting device 1 according to the first embodiment, and accordingly, a description thereof is omitted.

(Manufacturing Method of Wavelength Converter)

A manufacturing method of the wavelength converter 50A will be described. First, the metal substrate 35 is prepared, and a phosphor coating liquid to be coated on the surface of the metal substrate 35 is prepared. For example, the phosphor coating liquid includes a solvent, the inorganic adhesive and the phosphor. For example, alcohol such as ethanol or a mixed solvent of alcohol and water is used as the solvent. As the alcohol, those in each of which a boiling point is relatively low, such as methanol, ethanol and isopropyl alcohol (IPA), are preferable since they are easy to dry. For example, a polymethylsilsesquioxane sol (PMSQ sol) is used as the inorganic adhesive. The PMSQ sol may be prepared by dispersing the PMSQ into a solvent as appropriate. The phosphor coating liquid is prepared, for example, in such a manner that the phosphor is added to the inorganic adhesive that has a sol form and fluidity, and a resultant mixture is stirred and added with the solvent.

Figure 6:
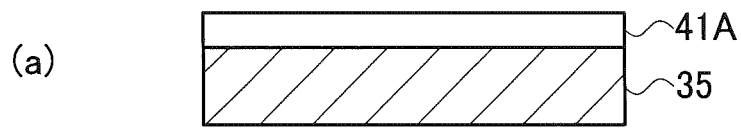
FIGS. 6A to 6C are views explaining a manufacturing process of the first modification example of the wavelength converter.
Figure 6:
Figure 6:
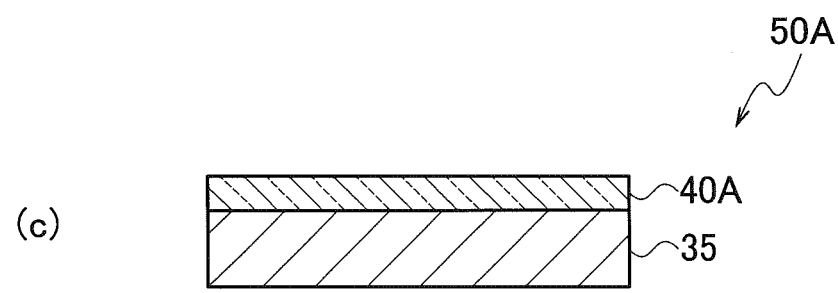

Next, as shown in FIG. 6A, the phosphor coating liquid is dropped on the surface of the metal substrate 35, and the metal substrate 35 with the dropped phosphor coating liquid is left standing, whereby a phosphor coating liquid layer 41A is formed on the surface of the metal substrate 35. Moreover, as shown in FIG. 6B, the phosphor coating liquid layer 41A is left standing, for example, at room temperature for 1 to 5 hours, whereby the phosphor coating liquid layer 41A is dried and a part of the solvent is removed, and a phosphor coating liquid dried body layer 42A is formed. Next, the metal substrate 35 on the surface of which the phosphor coating liquid dried body layer 42A is formed is heated at a temperature of 150 to 250° C. for 0.5 to 2 hours in the atmosphere. In this way, a residue of the solvent is removed, and as shown in FIG. 6C, the phosphor layer 40A having the light transmissivity is formed on the surface of the metal substrate 35, and the wavelength converter 50A is obtained.

(Second Modification Example of First Embodiment)

A second modification example of the first embodiment will be described. The second modification example is an example where the wavelength converter 50 of the light-emitting device 1 according to the first embodiment is replaced by a wavelength converter 50B as a third wavelength converter.

[Third Wavelength Converter]

Figure 7:
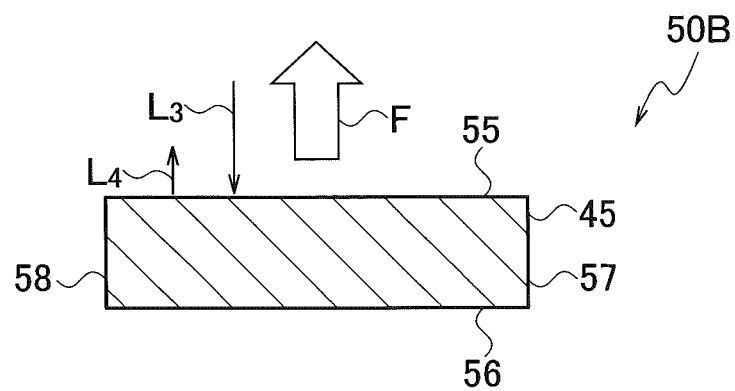
FIG. 7 is a cross-sectional view showing a second modification example of the wavelength converter.
Figure 8:
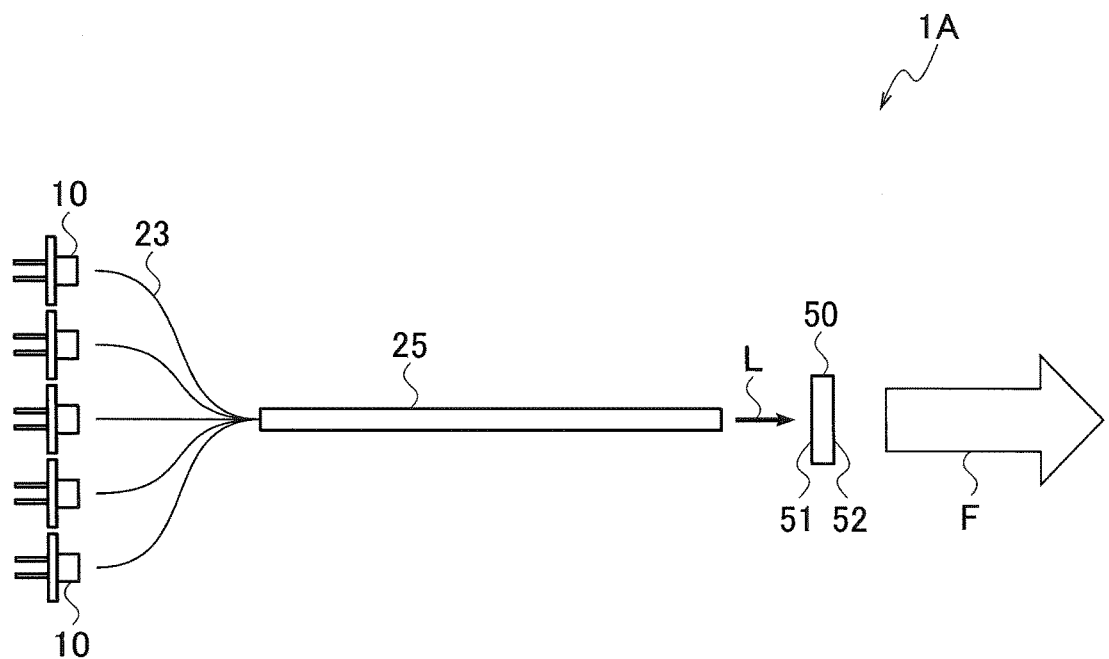
FIG. 8 is a cross-sectional view showing a light-emitting device according to a second embodiment of the present invention.

FIG. 7 is a cross-sectional view showing an example of the third wavelength converter 50B. As shown in FIG. 7, the wavelength converter 50B is composed of light-transmissive fluorescent ceramics 45 prepared by sintering the phosphor. The phosphor that composes the light-transmissive fluorescent ceramics 45 is the same as the phosphors for use in the first wavelength converter 50 and the second wavelength converter 50A except that a shape thereof is not powdery, and accordingly, a description thereof is omitted. Note that the light-transmissive fluorescent ceramics 45 may include all of the plural types of the phosphors, or may include one or more of the plural types of the phosphors. Moreover, in a case where the light-transmissive fluorescent ceramics 45 include only one type of the phosphors, other phosphors may have a form other than that of the light-transmissive fluorescent ceramics 45, for example, may be the wavelength converter 50 or the wavelength converter 50A.

The light-transmissive fluorescent ceramics are composed of only an inorganic material excellent in thermal conductivity, and accordingly, have high heat radiation properties. Therefore, even in a case where the phosphors in the fluorescent ceramics 45 are subjected to high density excitation by the laser light radiated from the solid-state light-emitting element 10, the temperature rise of the wavelength converter 50B can be suppressed effectively. As a result, temperature quenching of the phosphors in the wavelength converter 50B is suppressed, thus making it possible to increase the output of the emitted light.

(Functions)

Functions of the second modification example of the first embodiment will be described. The functions of the second modification example of the first embodiment are the same as the functions of the wavelength converter 50A of the first modification example of the first embodiment except that a portion of the wavelength converter 50B, from which the fluorescence F is radiated, is different from that of the wavelength converter 50A of the first modification example of the first embodiment. Therefore, the description of the functions will be partially omitted.

As shown in FIG. 7, the laser light L that has passed through the lens 20 of FIG. 1 is supplied as laser light $L_3$ from a front surface 55 that is a surface of the wavelength converter 50B of the second modification example to the light-transmissive fluorescent ceramics 45. A major part of the laser light $L_3$ enters the light-transmissive fluorescent ceramics 45 from the front surface 55 of the light-transmissive fluorescent ceramics 45, and a residue thereof is reflected on the front surface 55 and becomes laser light $L_4$. In the light-transmissive fluorescent ceramics 45, the fluorescence F is radiated from the phosphors excited by the laser light $L_3$, and the fluorescence F is radiated from the front surface 55.

Note that, in the wavelength converter 50B, compositions of the front surface 55, a back surface 56 and side surfaces 57 and 58 are the same, and accordingly, the fluorescence F can be radiated from the back surface 56, the side surfaces 57 and 58 and the like by irradiating the laser light L onto these respective surfaces.

A correlated color temperature and general color rendering index Ra of the output light of the second modification example of the first embodiment are the same as those of the light-emitting device 1 according to the first embodiment, and accordingly, a description thereof is omitted.

(Manufacturing Method of Wavelength Converter)

With regard to a manufacturing method of the wavelength converter 50B, the wavelength converter 50B can be manufactured by a publicly known method for preparing fluorescent ceramics.

Second Embodiment

A description will be made of functions of a light-emitting device 1A according to the second embodiment. The light-emitting device 1A according to the second embodiment is different from the light-emitting device 1 of the first embodiment in that a plurality of the solid-state light-emitting elements 10 are present. Moreover, the light-emitting device 1A according to the second embodiment is different from the light-emitting device 1 according to the first embodiment in that the laser light L radiated from the plurality of solid-state light-emitting elements 10 is condensed to the wavelength converter 50 through optical transmission lines 23 such as optical fibers in place of the lens 20. The light-emitting device 1A according to the second embodiment is the same as the light-emitting device 1 according to the first embodiment except for the above-described points, and accordingly, a description of the same points is omitted.

Optical fibers known in public are used as the optical transmission lines 23 for use in the light-emitting device 1A. A plurality of the optical transmission lines 23, which are provided so as to correspond to the plurality of solid-state light-emitting elements 10, are bundled to form an optical transmission line aggregate 25 such as an optical fiber aggregate.

Functions of the light-emitting device 1A are the same as the functions of the light-emitting device 1 except that the solid-state light-emitting elements 10 are plural, and that the laser light L radiated from the plurality of solid-state light-emitting elements 10 is condensed to the wavelength converter 50 through the optical transmission lines 23 and the optical transmission line aggregate 25. Therefore, the description of the functions is omitted.

Moreover, in the light-emitting device 1A, the wavelength converter 50A or 50B may be used in place of the wavelength converter 50 in a similar way to the light-emitting device 1.

The light-emitting device of this embodiment uses only the $Ce^{3+}$-activated phosphors, which are excellent in oxidation resistance at a high temperature in the atmosphere, as the phosphors for use in the wavelength converter. Accordingly, in the light-emitting device of this embodiment, the output and the long-term reliability are high even under the high density excitation by the irradiation of the laser light. Therefore, the light-emitting device of this embodiment is suitable for a laser lighting device or a laser projector.

EXAMPLES

Hereinafter, the present invention will be described more in detail by examples; however, the present invention is not limited to these examples.

Example 1

The light-emitting device 1 shown in FIG. 1 was fabricated. As the wavelength converter, the first wavelength converter 50 was fabricated, which includes: the transparent substrate 30 that does include the phosphors; and the phosphor layer 40.

First, a quartz substrate (50×50×1 mm thick) was prepared as the substrate to be coated with the phosphors. Moreover, as the phosphors activated with $Ce^{3+}$, there were prepared a $Y_3Ga_2(AlO_4)_3:Ce^{3+}$-green phosphor (light emission peak: 530 nm) and a $Y_3Mg_2(AlO_4)(SiO_4)_2:Ce^{3+}$-red phosphor (light emission peak: 625 nm). Note that the above-described phosphors were powder phosphors in which a center particle size ranged from 5 to 20 nm.

(Preparation of Phosphor Coating Liquid)

Polyethylene oxide (PEO, weight-average molecular weight: approximately 1,000,000) as a thickener was dissolved into distilled water as a solvent by using a stirring device, whereby a PEO aqueous solution was obtained. At the time of the later-described addition of the phosphors, a blended amount of PEO in the PEO aqueous solution was adjusted so as to be 15 mg with respect to 1 g as a total amount of the above-described green phosphor and the above-described red phosphor.

Next, the PEO aqueous solution was added with the above-described green phosphor and the above-described red phosphor, followed by stirring. Added amounts of the above-described green phosphor and the above-described red phosphor were set so that the total amount of the above-described green phosphor and the above-described red phosphor could be 1 g with respect to 15 mg of the PEO in the PEO aqueous solution. Moreover, the PEO aqueous solution added with the phosphors was added with ultrafine particle alumina (average particle size: 30 nm) as the adhesive, followed by stirring, whereby a phosphor coating liquid was prepared. An added amount of the ultrafine particle alumina was set so as to be 30 mg with respect to 1 g of the total amount of the above-described green phosphor and the above-described red phosphor.

(Formation of Phosphor Layer)

The above-described phosphor coating liquid was dropped onto the above-described quartz substrate, and was left standing in a natural state, whereby the phosphor coating liquid was adhered to one surface of the quartz substrate. Next, the phosphor coating liquid was dried by blowing hot air of 60° C. to the adhered phosphor coating liquid for 10 minutes, whereby a fluorescent film (phosphor coating liquid dried body layer) was formed on the surface of the quartz substrate. The quartz substrate, on which the fluorescent film including the phosphors was formed, was put into an electric furnace, and was heated at 600° C. for 30 minutes. Then, the PEO in the fluorescent film was burned out, and a phosphor layer was formed on the quartz substrate. In this way, such a wavelength converter in which the phosphor layer was formed on the quartz substrate was obtained. Note that, in the phosphor layer, the above-described green phosphor and the above-described red phosphor were dispersed into a light-transmissive alumina layer composed in such a manner that ultrafine particles of alumina were bonded to one another. The light-emitting device 1 shown in FIG. 1 was fabricated by using the obtained wavelength converter and a blue laser diode (peak wavelength: 450 nm).

Example 2

As the transparent substrate, a $Y_3Al_2(AlO_4)_3: Ce^{3+}$ substrate (10×10×0.5 mm thick) as a light-transmissive fluorescent ceramic substrate that exhibits emission of green light with a light emission peak of 555 nm was used in place of the quartz substrate of Example 1. Moreover, a phosphor coating liquid including only the $Y_3Mg_2(AlO_4)(SiO_4)_2:Ce^{3+}$-red phosphor (light emission peak: 625 nm) as the phosphor was used in place of the phosphor coating liquid of Example 1. An added amount of the above-described red phosphor in the phosphor coating liquid was set so as to be 1 g with respect to 15 mg of the PEO in the PEO aqueous solution. Then, a wavelength converter was obtained in a similar way to Example 1 except for using the above-described light-transmissive fluorescent ceramic substrate and the above-described phosphor coating liquid, whereby the light-emitting device 1 shown in FIG. 1 was fabricated. The wavelength converter was formed as one in which a red light-emitting phosphor layer was formed on a light-transmissive green light-emitting fluorescent ceramic substrate.

Example 3

A light-emitting device similar to the light-emitting device 1 shown in FIG. 1 was fabricated. Note that, as the wavelength converter, the second wavelength converter 50A including the metal substrate and the phosphor layer was fabricated. Therefore, the radiation direction of the fluorescence F from the wavelength converter 50A became as shown in FIG. 5.

First, an Al metal substrate (20×20×1 mm thick) was prepared as the substrate to be coated with the phosphors. Moreover, as the phosphors activated with Ce3+, there were prepared a $Lu_3Al_2(AlO_4)_3:Ce^{3+}$-green phosphor (light emission peak: 513 nm) and a $Y_3Mg_2(AlO_4)(SiO_4)_2:Ce^{3+}$-red phosphor (light emission peak: 625 nm). The above-described phosphors were powder phosphors in which a center particle size ranged from 5 to 20 nm.
(Preparation of Phosphor Coating Liquid)

The polymethylsilsesquioxane sol (PMSQ sol) was used as the inorganic adhesive. The PMSQ sol was a sol in which polymethylsilsesquioxane (PMSQO was dispersed into ethanol as a solvent. At the time of the later-described addition of the phosphors, a content of the PMSQ in the PMSQ sol was adjusted so as to be 350 mg with respect to 1 g as a total amount of the above-described green phosphor and the above-described red phosphor.

Next, the PMSQ sol was added with the above-described green phosphor and the above-described red phosphor, and was stirred by using a stirring device. Added amounts of the above-described green phosphor and the above-described red phosphor were set so that the total amount of the above-described green phosphor and the above-described red phosphor could be 1 g with respect to 350 mg of the PMSQ in the PMSQ sol. Moreover, the PMSQ sol added with the phosphors was added with the ethanol as the solvent as appropriate, and viscosity of the PMSQ sol was adjusted.
(Formation of Phosphor Layer)

The above-described phosphor coating liquid was dropped onto the above-described Al metal substrate, and was left standing in a natural state, whereby the phosphor coating liquid was adhered to one surface of the Al metal substrate. Next, the adhered phosphor coating liquid was dried at room temperature for 3 hours, and a fluorescent film (phosphor coating liquid dried body layer) was formed on the surface of the Al metal substrate. The Al metal substrate, on which the fluorescent film including the phosphors was formed, was put into a dryer, and was heated at 200° C. for 1 hour. Then, the ethanol was evaporated, and a phosphor layer having light transmissivity was formed on the Al metal substrate. In this way, such a wavelength converter in which the phosphor layer was formed on the Al metal substrate was obtained. Note that, in the phosphor layer, the above-described green phosphor and the above-described red phosphor were dispersed into the PMSQ. A light-emitting device similar to the light-emitting device 1 shown in FIG. 1 was fabricated by using the obtained wavelength converter.

A spectral distribution of output light radiated by the light-emitting device of Example 3 was created by simulation. The simulation was performed by using a spectral distribution of the blue laser diode and data of light emission spectra of the $Lu_3Al_2(AlO_4)_3:Ce^{3+}$-green phosphor and the $Y_3Mg_2(AlO_4)(SiO_4)_2:Ce^{3+}$-red phosphor. A peak wavelength of the blue laser diode was defined as 450 nm and 460 nm.

Figure 9:
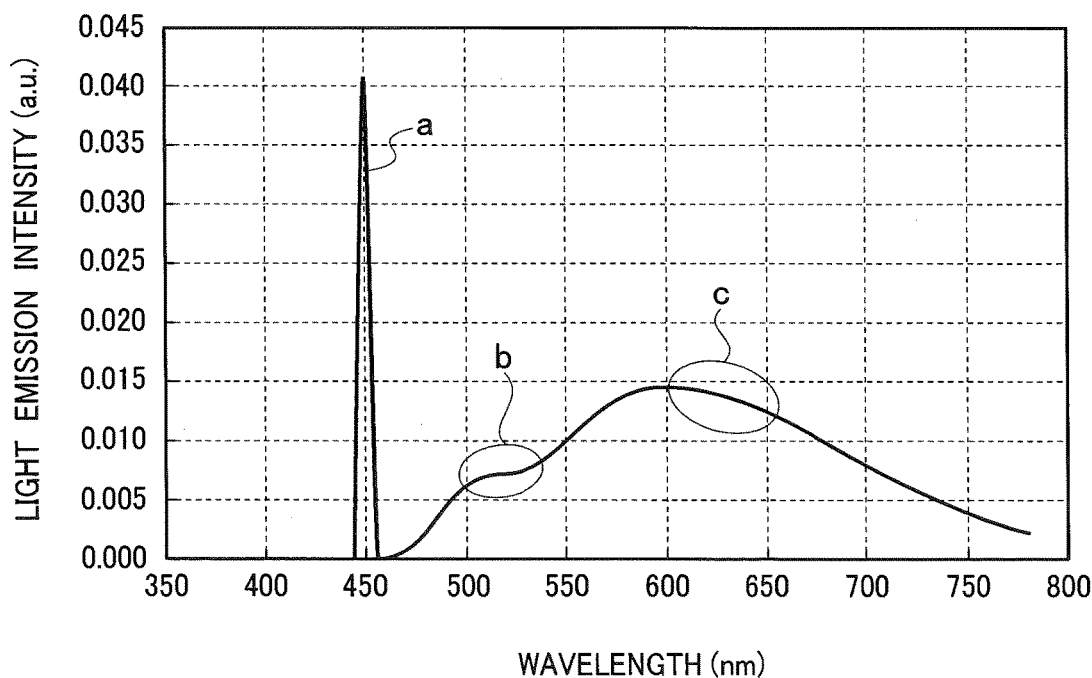
FIG. 9 is an example of a spectral distribution curve of output light, which is created by a simulation.
Figure 10:
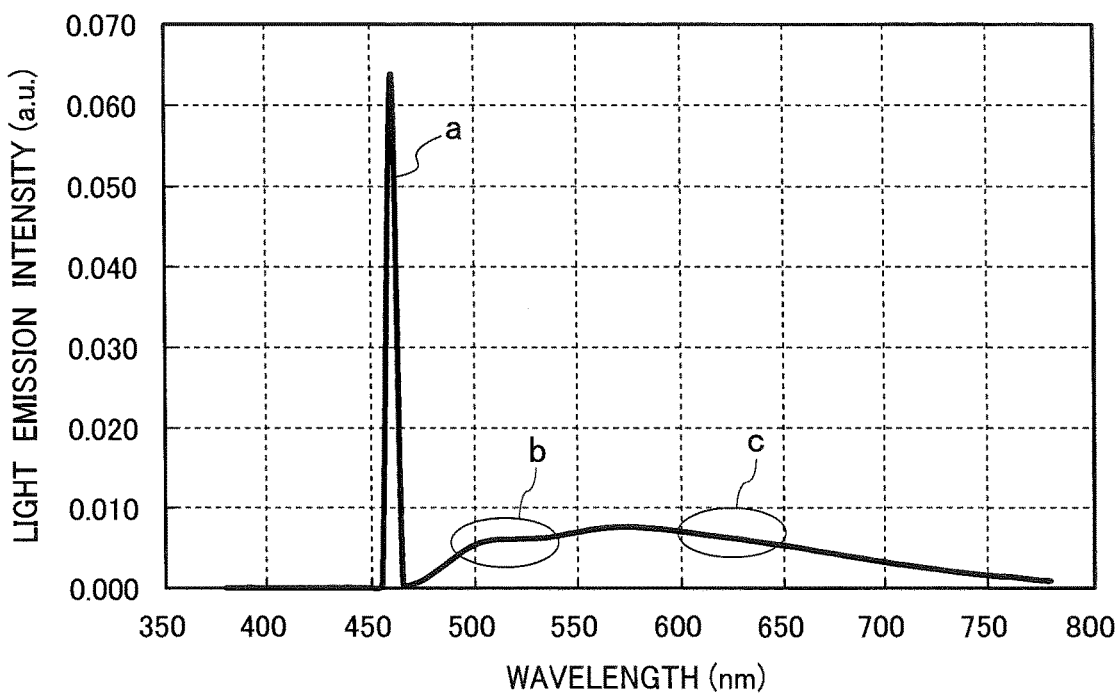
FIG. 10 is another example of the spectral distribution curve of the output light, which is created by the simulation.

FIG. 9 and FIG. 10 show examples of a spectral distribution curve of the output light, which is created by the simulation. FIG. 9 shows an example of a case where the peak wavelength of the spectral distribution curve of the blue laser light radiated by the blue laser diode as a solid-state light-emitting element is 450 nm. FIG. 10 shows an example of a case where the peak wavelength of the spectral distribution curve of the blue laser light radiated by the blue laser diode as a solid-state light-emitting element is 460 nm.

Curve portions having emission line-like sharp peaks, the curve portions being denoted by reference symbol a in FIG. 9 and FIG. 10, are portions corresponding to the spectral distribution curves (peak wavelengths: 450 nm and 460 nm) of the blue laser light radiated by the blue laser diode as a solid-state light-emitting element. Moreover, curve portions showing gentle changes, the curve portions including portions denoted by reference symbol b and reference symbol c in FIG. 9 and FIG. 10, are portions corresponding to the spectral distribution curves of fluorescence radiated by the phosphors in the wavelength converters when the phosphors have received the laser light. More specifically, the portion corresponding to the latter spectral distribution curve of the fluorescence includes: a shoulder-like green light component with a wavelength of 500 nm to 530 nm, which is denoted by reference symbol b; and a red light component with a wavelength of 600 nm or more, which is demoted by reference symbol c. The shoulder-like green light component denoted by reference symbol b is a light-emitting component of the $Lu_3Al_2(AlO_4)_3:Ce^{3+}$-green phosphor. Moreover, the red light component with a wavelength of 600 nm or more, which is denoted by reference symbol c, is a light-emitting component of the $Y_3Mg_2(AlO_4)(SiO_4)_2:Ce^{3+}$-red phosphor.

From FIG. 9 and FIG. 10, it is seen that blue to red light components are obtained when the light-emitting device of Example 3 is used. Note that the light having the spectral distribution shown in FIG. 9 has a correlated color temperature of 3000 K and Ra of 85, and the light having the spectral distribution shown in FIG. 10 has a correlated color temperature of 5000 K and Ra of 88. The light having each of the spectral distribution curves shown in FIG. 9 and FIG. 10 has a preferable spectral distribution for lighting. Note that the $Y_3Ga_2(AlO_4)_3:Ce^{3+}$-green phosphor of Example 1 also have light emission properties similar to those of the $Lu_3Al_2(AlO_4)_3:Ce^{3+}$-green phosphor of Example 3. Therefore, it is inferred that similar effects to those in FIG. 9 and FIG. 10 are also obtained in a case of performing simulation by using the $Y_3Ga_2(AlO_4)_3:Ce^{3+}$-green phosphor of Example 1.

Figure 11:
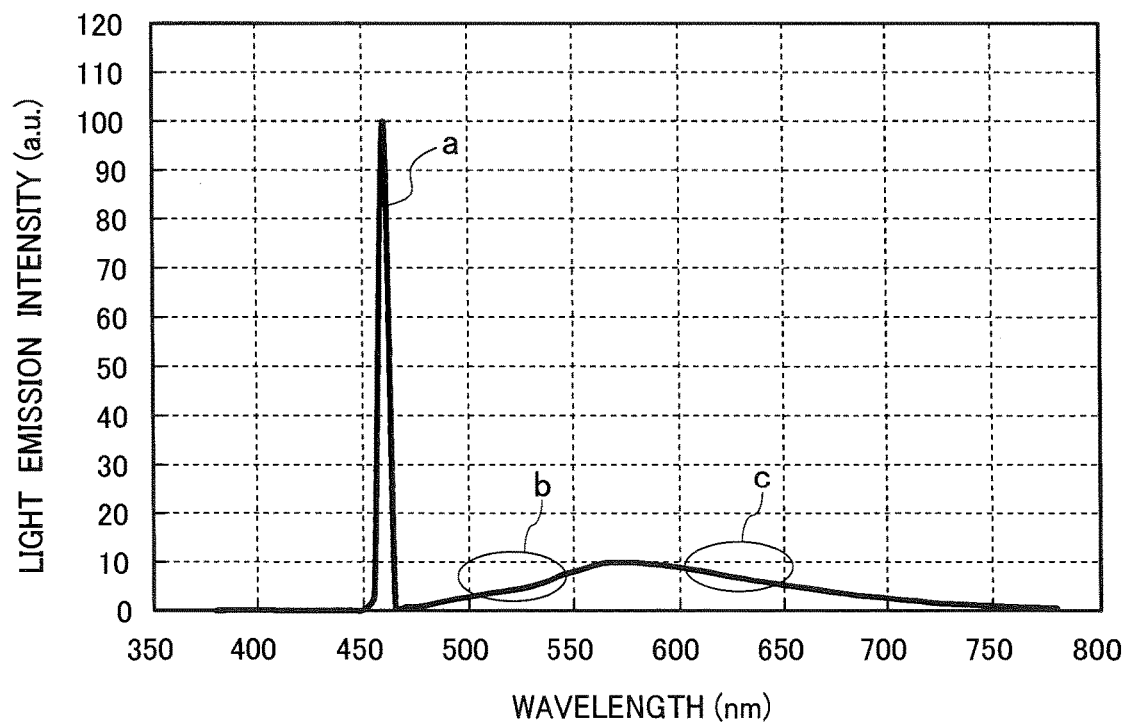
FIG. 11 is an example of a spectral distribution curve of output light, which is actually measured by using the light-emitting device.

FIG. 11 shows an example of a spectral distribution curve of output light actually measured by using a light-emitting device configured simply for the purpose of evaluating color rendering properties of actual illumination light. In this light-emitting device, as excitation light, blue light was used, in which a light emission peak wavelength was 460 nm and a half width of a light emission spectrum was approximately 4 nm. Moreover, in this light-emitting device, as such a phosphor that composes the wavelength converter, a mixed phosphor was used, which was composed of 20 mass parts of the $Lu_3Al_2(AlO_4)_3:Ce^{3+}$-green phosphor and 80 mass parts of the $Y_3Mg_2(AlO_4)(SiO_4)_2:Ce^{3+}$-red phosphor. Note that the spectral distribution of FIG. 11 is data obtained by using a multichannel spectrometer (MCPD-98000: made by Otsuka Electronics Co., Ltd.). It is seen that illumination light having the spectral distribution curve shown in FIG. 11 has a correlated color temperature of 5100 K and Ra of 81, and is light preferable for lighting.

Note that, in the above-described light-emitting device configured simply, a mixing ratio, mixed amounts, types and the like of the phosphors are adjusted, whereby it is possible to obtain light with such a spectral distribution and a color tone as shown in each of FIG. 9 and FIG. 10.

The entire content of Japanese Patent Application No. P2014-251452 (filed on: Dec. 12, 2014) is herein incorporated by reference.

Although the present invention has been described above by reference to the embodiments and the example, the present invention is not limited to those, and it will be apparent to these skilled in the art that various modifications and improvements can be made.

INDUSTRIAL APPLICABILITY

The light-emitting device of the present invention has high output and high long-term reliability.

REFERENCE SIGNS LIST 1 light-emitting device
10 solid-state light-emitting element
30 transparent substrate
35 metal substrate
40, 40A phosphor layer
41, 41A phosphor coating liquid layer
42, 42A phosphor coating liquid dried body layer
45 fluorescent ceramics
50, 50A, 50B wavelength converter

The invention claimed is:

1. A light-emitting device comprising:
a solid-state light-emitting element that radiates laser light; and
a wavelength converter that includes a plurality of different types of phosphors which receive the laser light and radiate light,
wherein the plurality of different types of phosphors included in the wavelength converter are each substantially composed of $Ce^{3+}$-activated phosphors, and include at least a warm-color $Ce^{3+}$-activated phosphor that receives the laser light and radiates light having a light emission peak within a wavelength range of 580 nm or more to less than 660 nm, and
light-emitting components radiated by the phosphors are composed of only light-emitting components derived from $Ce^{3+}$.

2. The light-emitting device according to claim 1, wherein the phosphors included in the wavelength converter include the warm-color $Ce^{3+}$-activated phosphor and a green $Ce^{3+}$-activated phosphor that receives the laser light and radiates light having a light emission peak within a wavelength range of 500 nm or more to less than 560 nm.

3. The light-emitting device according to claim 1, wherein the warm-color $Ce^{3+}$-activated phosphor is a red $Ce^{3+}$-activated phosphor that radiates light having a light emission peak within a wavelength range of 600 nm or more to less than 660 nm.

4. The light-emitting device according to claim 1, wherein the wavelength converter is composed of an inorganic material.

5. The light-emitting device according to claim 1, wherein the wavelength converter includes: a transparent substrate through which the laser light passes; and a phosphor layer formed on a surface of the transparent substrate, the phosphor layer including the phosphors, and
the phosphor layer includes: the phosphors; and an inorganic adhesive that adheres the phosphors to the transparent substrate.

6. The light-emitting device according to claim 1, wherein the wavelength converter includes: a metal substrate on which the laser light is reflected; and a phosphor layer formed on a surface of the metal substrate, the phosphor layer including the phosphors, and
the phosphor layer includes: the phosphors; and an inorganic adhesive that adheres the phosphors to the metal substrate.

7. The light-emitting device according to claim 1, wherein the wavelength converter is composed of fluorescent ceramics prepared by sintering the phosphors.

8. The light-emitting device according to claim 1, wherein all of the $Ce^{3+}$-activated phosphors included in the wavelength converter are $Ce^{3+}$-activated oxide phosphors.

9. The light-emitting device according to claim 1, wherein the $Ce^{3+}$-activated oxide phosphors are $Ce^{3+}$-activated oxide phosphors having a garnet structure.

10. The light-emitting device according to claim 1, wherein the laser light has a maximum intensity value within a wavelength range of 420 nm or more to less than 480 nm.

11. The light-emitting device according to claim 1, wherein the phosphors include a $Ce^{3+}$-activated phosphor that receives the laser light and radiates light having a light emission peak within a wavelength range of 480 nm or more to less than 500 nm.

12. The light-emitting device according to claim 1, wherein the phosphors are powdery.

13. The light-emitting device according to claim 1, wherein the light-emitting device radiates output light in which a correlated color temperature is 2500 K or more to less than 7000 K.

14. The light-emitting device according to claim 1, wherein the light-emitting device radiates output light in which a general color rendering index Ra is 80 or more to less than 90.

15. The light-emitting device according to claim 1, wherein the light-emitting device is a laser lighting device or a laser projector.

16. The light-emitting device according to claim 1, wherein the green $Ce^{3+}$-activated phosphor is $Lu_3Al_2(AlO_4)_3:Ce^{3+}$, $(Y,Lu)_3Al_2(AlO_4)_3:Ce^{3+}$, $Y_3Al_2(AlO_4)_3:Ce^{3+}$, $Y_3Ga_2(AlO_4)_3:Ce^{3+}$, or $Ca_3Sc_2(SiO_4)_3:Ce^{3+}$.

* * * * *